United States Patent
Kubena et al.

(10) Patent No.: US 12,166,471 B2
(45) Date of Patent: Dec. 10, 2024

(54) QUARTZ MEMS PIEZOELECTRIC RESONATOR FOR CHIPSCALE RF ANTENNAE

(71) Applicant: HRL Laboratories, LLC, Malibu, CA (US)

(72) Inventors: Randall L. Kubena, Oak Park, CA (US); Walter S. Wall, Santa Monica, CA (US)

(73) Assignee: HRL LABORATORIES, LLC, Malibu, CA (US)

( * ) Notice: Subject to any disclaimer, the term of this patent is extended or adjusted under 35 U.S.C. 154(b) by 425 days.

(21) Appl. No.: 17/574,200

(22) Filed: Jan. 12, 2022

(65) Prior Publication Data
US 2022/0140813 A1    May 5, 2022

Related U.S. Application Data

(62) Division of application No. 15/965,652, filed on Apr. 27, 2018, now Pat. No. 11,239,823.
(Continued)

(51) Int. Cl.
*H03H 9/19* (2006.01)
*B81B 3/00* (2006.01)
(Continued)

(52) U.S. Cl.
CPC ............ *H03H 9/19* (2013.01); *B81B 3/0018* (2013.01); *H01Q 1/12* (2013.01); *H01Q 9/04* (2013.01);
(Continued)

(58) Field of Classification Search
CPC .............. H01Q 1/38; H01Q 9/04; H03H 9/19; H03H 3/02; H03H 2009/155; H03H 9/22; Y10T 29/49016
(Continued)

(56) References Cited

U.S. PATENT DOCUMENTS

| 4,314,204 A | 2/1982 | Biehl |
| 5,659,270 A | 8/1997 | Millen |

(Continued)

FOREIGN PATENT DOCUMENTS

| EP | 496583 | 7/1992 |
| WO | 2009-045576 | 4/2009 |
| WO | 2015-072985 | 5/2015 |

OTHER PUBLICATIONS

U.S. Appl. No. 16/775,242, filed Jan. 28, 2020, Kubena.
From U.S. Appl. No. 15/965,652 (now U.S. Pat. No. 11,239,823), Notice of Allowance mailed on Jan. 21, 2022.
(Continued)

*Primary Examiner* — Thiem D Phan
(74) *Attorney, Agent, or Firm* — Ladas & Parry, LLP

(57) ABSTRACT

A RF antenna having a magnetostrictive film may be made by patterning selected portions of a top surface of the quartz wafer for deposition of electrode metal and deposition of the magnetostrictive film and depositing the electrode metal and the magnetostrictive film; temporarily bonding the quartz wafer to a handle wafer; thinning the quartz wafer to a desired thickness; etching the quartz wafer to define the outlines of at least one quartz resonator bearing the electrode metal and the magnetostrictive film; patterning selected portions of a bottom surface the at least one quartz resonator for deposition of electrode metal and at least one bond pad and depositing the electrode metal and the at least one bond pad; bonding the at least one quartz resonator to a substrate wafer; and releasing the at least one quartz resonator from the handle wafer.

7 Claims, 6 Drawing Sheets

Related U.S. Application Data

(60) Provisional application No. 62/521,174, filed on Jun. 16, 2017.

(51) Int. Cl.
*H01Q 1/12* (2006.01)
*H01Q 9/04* (2006.01)
*H10N 30/853* (2023.01)
*H03H 9/15* (2006.01)

(52) U.S. Cl.
CPC ..... *H10N 30/853* (2023.02); *H03H 2009/155* (2013.01); *Y10T 29/49016* (2015.01)

(58) Field of Classification Search
USPC .................................. 29/600, 428, 601, 825
See application file for complete search history.

(56) References Cited

U.S. PATENT DOCUMENTS

| | | | |
|---|---|---|---|
| 5,962,786 A | 10/1999 | Le Traon | |
| 6,194,900 B1 | 2/2001 | Freeman | |
| 6,483,480 B1 | 11/2002 | Sievenpiper | |
| 6,812,903 B1 | 11/2004 | Sievenpiper | |
| 6,888,424 B2 | 5/2005 | Takeuchi | |
| 7,575,807 B1 | 8/2009 | Barvosa-Carter | |
| 7,716,985 B2 | 5/2010 | Zhang | |
| 7,750,535 B2 | 7/2010 | Kubena | |
| 7,774,155 B2 | 8/2010 | Sato | |
| 7,851,971 B2 | 12/2010 | Chang | |
| 7,892,630 B1 | 2/2011 | McKnight | |
| 7,892,876 B2 | 2/2011 | Mehregany | |
| 8,390,387 B2 | 3/2013 | Lander | |
| 8,765,615 B1 * | 7/2014 | Chang | H01L 21/31056 438/700 |
| 8,803,751 B1 | 8/2014 | Miller | |
| 8,912,711 B1 | 12/2014 | Chang | |
| 9,061,886 B1 * | 6/2015 | Nguyen | B81B 3/0021 |
| 9,211,690 B1 | 12/2015 | McKnight | |
| 9,250,074 B1 | 2/2016 | Kubena | |
| 9,250,452 B1 | 2/2016 | Yap | |
| 9,383,208 B2 | 7/2016 | Mohanty | |
| 9,825,610 B1 | 11/2017 | Churchill | |
| 9,879,997 B1 | 1/2018 | Kubena | |
| 9,977,097 B1 | 5/2018 | Nguyen | |
| 9,991,863 B1 | 6/2018 | Kubena | |
| 10,031,191 B1 | 7/2018 | Nguyen | |
| 10,110,198 B1 | 10/2018 | Kubena | |
| 10,126,376 B1 | 11/2018 | Nguyen | |
| 10,175,307 B1 | 1/2019 | Sorenson | |
| 10,266,398 B1 | 4/2019 | Kubena | |
| 10,308,505 B1 | 6/2019 | Kirby | |
| 10,389,392 B1 | 8/2019 | Kubena | |
| 10,819,276 B1 | 10/2020 | Kubena | |
| 10,921,360 B2 | 1/2021 | Kubena | |
| 11,101,786 B1 | 8/2021 | Kubena | |
| 11,145,982 B2 | 10/2021 | Wall | |
| 11,239,823 B1 | 2/2022 | Kubena | |
| 2002/0166379 A1 | 11/2002 | Paros | |
| 2004/0194548 A1 | 10/2004 | Dayagi | |
| 2004/0263408 A1 | 12/2004 | Sievenpiper | |
| 2005/0082944 A1 | 4/2005 | Thompson | |
| 2005/0122115 A1 | 6/2005 | Maguire | |
| 2005/0174014 A1 | 8/2005 | Korden | |
| 2006/0160136 A1 | 7/2006 | Xiang | |
| 2007/0001773 A1 | 1/2007 | Oxborrow | |
| 2007/0017287 A1 | 1/2007 | Kubena | |
| 2007/0082642 A1 | 4/2007 | Hattori | |
| 2007/0180911 A1 | 8/2007 | Shoji | |
| 2007/0205849 A1 | 9/2007 | Otis | |
| 2007/0216406 A1 | 9/2007 | Witcraft | |
| 2008/0136418 A1 | 6/2008 | Renz | |
| 2008/0163689 A1 | 7/2008 | Thompson | |
| 2009/0003136 A1 | 1/2009 | Karr | |
| 2009/0109048 A1 | 4/2009 | Spivak | |
| 2009/0147254 A1 | 6/2009 | Kirby | |
| 2010/0176809 A1 | 7/2010 | Biber | |
| 2011/0062955 A1 | 3/2011 | Miller | |
| 2013/0201316 A1 | 8/2013 | Binder | |
| 2013/0217979 A1 | 8/2013 | Blackadar | |
| 2014/0111019 A1 | 4/2014 | Roy | |
| 2014/0113828 A1 | 4/2014 | Gilbert | |
| 2015/0295320 A1 | 10/2015 | Lee | |
| 2015/0323694 A1 | 11/2015 | Roy | |
| 2016/0003924 A1 | 1/2016 | Sun | |
| 2016/0118954 A1 | 4/2016 | Clark | |
| 2016/0209478 A1 | 7/2016 | Forstner | |
| 2016/0380357 A1 | 12/2016 | Keller | |
| 2017/0141622 A1 | 5/2017 | Meichle | |
| 2017/0212060 A1 | 7/2017 | Hao | |
| 2017/0244377 A1 | 8/2017 | Yamane | |
| 2017/0276848 A1 | 9/2017 | Sinclair | |
| 2017/0345449 A1 | 11/2017 | Shibata | |
| 2017/0359025 A1 | 12/2017 | Kishi | |
| 2018/0040666 A1 | 2/2018 | Shibata | |
| 2018/0057409 A1 | 3/2018 | Rosseinsky | |
| 2018/0083595 A1 | 3/2018 | Kaida | |
| 2018/0115070 A1 | 4/2018 | Wang | |
| 2018/0226720 A1 | 8/2018 | Wall | |
| 2018/0248516 A1 | 8/2018 | Nota | |
| 2018/0302032 A1 | 10/2018 | Oya | |
| 2018/0323768 A1 | 11/2018 | Ikeda | |
| 2019/0072374 A1 | 3/2019 | Mann | |
| 2019/0123714 A1 | 4/2019 | Kizu | |
| 2019/0245254 A1 | 8/2019 | Yamane | |
| 2021/0242606 A1 | 8/2021 | Sepulveda | |
| 2021/0249468 A1 | 8/2021 | Heron | |

OTHER PUBLICATIONS

From U.S. Appl. No. 15/965,652 (now U.S. Pat. No. 11,239,823), Notice of Allowance mailed on Jan. 18, 2022.
From U.S. Appl. No. 15/965,652 (now U.S. Pat. No. 11,239,823), Notice of Allowance mailed on Sep. 24, 2021.
From U.S. Appl. No. 15/965,652 (now U.S. Pat. No. 11,239,823), Office Action mailed on Aug. 17, 2021.
From U.S. Appl. No. 15/965,652 (now U.S. Pat. No. 11,239,823), Office Action mailed on May 20, 2021.
From U.S. Appl. No. 15/801,642 (now U.S. Pat. No. 10,389,392), Notice of Allowance mailed on Apr. 5, 2019.
From U.S. Appl. No. 15/801,642 (now U.S. Pat. No. 10,389,392), Notice of Allowance mailed on Jan. 29, 2019.
From U.S. Appl. No. 15/801,642 (now U.S. Pat. No. 10,389,392), Notice of Allowance mailed on Dec. 19, 2018.
From U.S. Appl. No. 15/801,642 (now U.S. Pat. No. 10,389,392), Office Action mailed on Jun. 14, 2018.
From U.S. Appl. No. 16/269,847, Office Action dated Apr. 27, 2020.
From U.S. Appl. No. 15/899,122, Office Action dated Feb. 16, 2021.
From U.S. Appl. No. 15/899,122, Office Action dated Jul. 24, 2020.
From U.S. Appl. No. 16/269,847, Office Action dated Oct. 17, 2019.
From U.S. Appl. No. 15/801,642, Notice of Allowance dated Jan. 29, 2019.
From U.S. Appl. No. 15/801,642, Notice of Allowance dated Dec. 19, 2018.
From U.S. Appl. No. 15/801,642, Office Action dated Jun. 14, 2018.
Azad, U., et al., "Direct Antenna Modulation (DAM) for Enhanced Capacity Performance of Near-Field Communication (NFC) Link," IEEE Transactions on Circuits and Systems—I: Regular Papers vol. 61, No. 3, pp. 902-910, Mar. 2014.
Filter Inductors—1812FS Series Datasheet, Oct. 12, 2015, retrieved online at: www.coilcraft.com/pdfs/1812fs.pdf.
Gamble, J.T., "Wideband Coherent Communication at VLF with the Experimental Transmitting Antenna Modulator (ETAM)," No. RADC-TR-73-287, Rome Air Development Center, Air Force Systems Command, Griffiss Air Force Base, NY, Dec. 1973.
Griffith, W.C. et al., "Miniature atomic magnetometer integrated with flux concentrators," Applied Physics Letters 94, 023502 (2009) (3 pages).
Hansen, R.C et al., "Small Antenna Handbook," John Wiley & Sons, Inc., 2011, Chapter 3.

(56) References Cited

OTHER PUBLICATIONS

Kawashima, H., "New Cuts for Width-Extensional Mode Quartz Crystal Resonators," Electronics & Communications in Japan, Part 3, vol. 76, No. 12, pp. 28-36, Apr. 1993.

Kim, H.J. et al., "Piezoelectric/Magnetostructure MEMS Resonant Sensor Array for in-Plane Multi-Axis Magnetic Field Detection," IEEE Mems 2017.

Kirby, et al. "Miniaturized VHF Quartz MEMs Resonator Design Methodology," 2017 Frequency Control Symposium, Jul. 10-13, 2017, Besancon, France.

Klemmer, T.J. et al., "Ultrahigh Frequency Permeability of Sputtered Fe—Co—B Thin Films," Journal of Applied Physics, vol. 87, No. 2, Jan. 15, 2000.

Kubena, R. "UHF Quartz MEMS Oscillators for Dynamics-Based System Enhancements," 2013 IEEE International Frequency Control Symposium, Prague, Czech Republic, Jul. 22-26, 2013 (8 pages).

Kubena, R., et al., "A Fully Integrated Quartz MEMS VHF TCXO," 2017.

Kubena, R., et al., "MEMS-based UHF Monolithic Crystal Filters for Integrated RF Circuits," Journal of Microelectromechanical Systems, vol. 25, No. 1, pp. 118-124, Feb. 2016.

Kubena, R., et al., "Next Generation Quartz Oscillators and Filters for VHF-UHF Systems," 2006 IEEE International Microwave Symposium, San Francisco, CA, Jun. 11-16, 2006, pp. 668-671.

Kubena, R, et al. "Wide-band multiferroic quartz MEMS antennae" Journal of Physics: Conference Series, 2019, pp. 1-5.

Li, M. et al., "Ultra-Sensitive MEMS Magnetoelectric Sensor for Picotesla DC Magnetic Field Detection" MEMS 2017, Applied Physics Letter, 110 (2017).

Liang, C-Y et al., "Modeling of Magnetoelastic Nanostructures with a Fully Coupled Mechanical-Micromagnetic Model," Nanotechnology 25 (2014).

Nan, T. et al., "Acoustically Actuated Ultra-Compact NEMS Magnetoelectric Antennas," Nature Communications, 8:296 (2017).

Pang, et al., "Magnetostrictive-Based Quartz MEMS RF Sensors," 2018 IEEE International Frequency Control Symposium (IFCS), 2018, pp. 1-6, doi: 10.1109/FCS.2018.8597519. (Year: 2018).

Statek, CX1SM Crystal Datasheet, first accessed Mar. 14, 2016.

Ungan, T., et al., "RF Energy Harvesting Design Using High Q Resonators," IEEE MTT-S International Microwave Workshop on Wireless Sensing, Local Positioning, and RFID, IMWS 2009, pp. 1-4. IEEE, 2009 (4 pages).

Yao, Zhi, et al., "Bulk Acoustic Wave Mediated Multiferroic Antennas: Architecture and Performance Bound," IEEE Transactions on Antennas and Propagation, vol. 63, No. 8, Aug. 2015, pp. 3335-3344.

Zhai, J. et al., "Detection of Pico-Tesla Magnetic Fields using Magnetic-Electric Sensors at Room Temperature," Applied Physics Letters 88, (2006).

\* cited by examiner

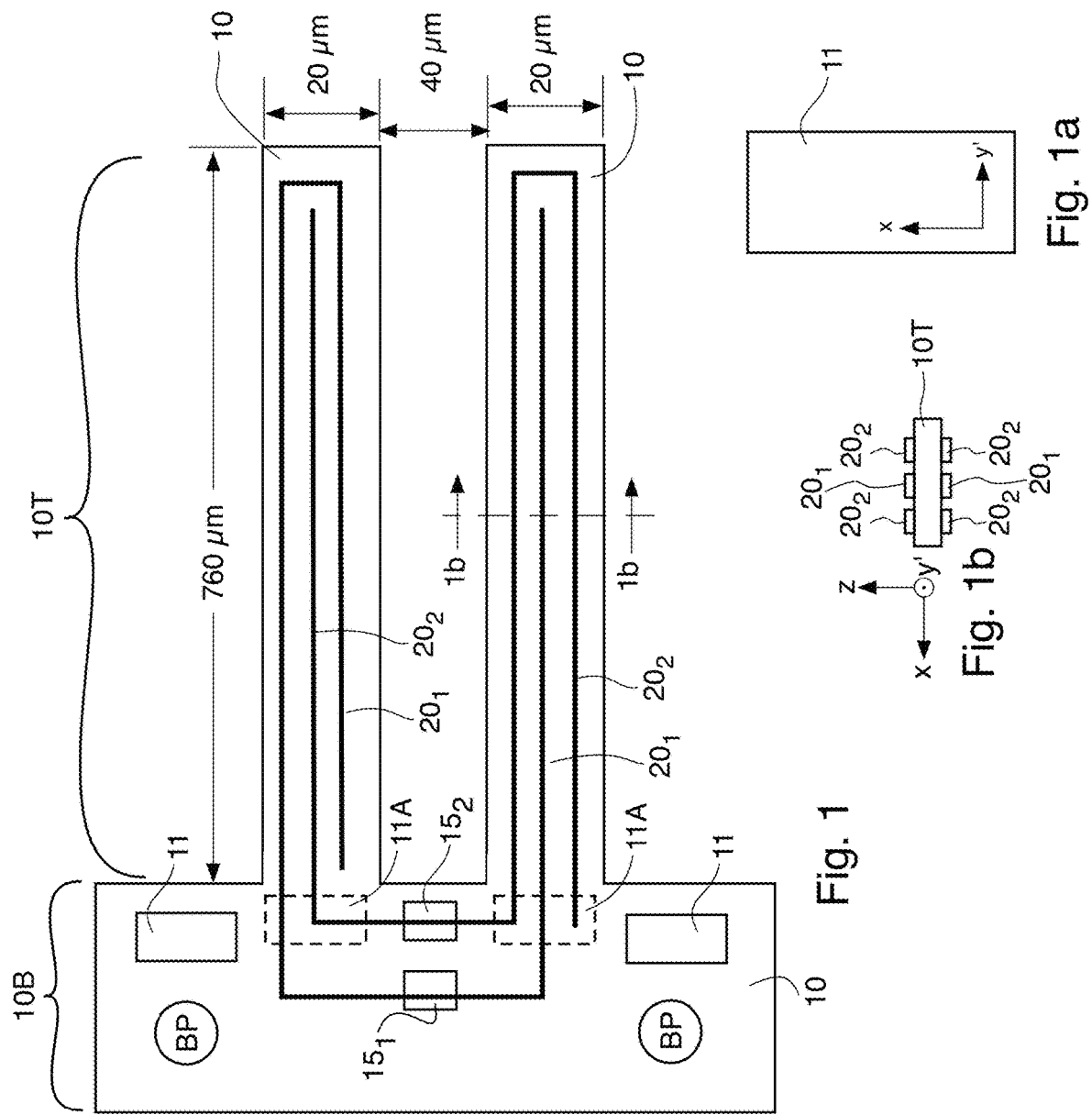

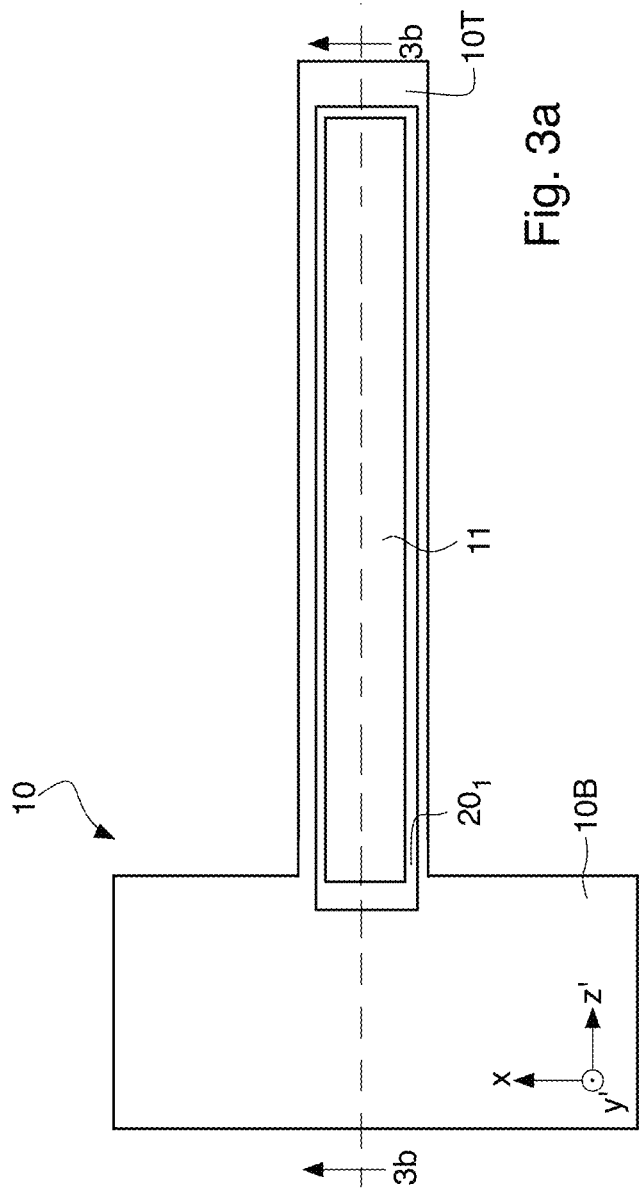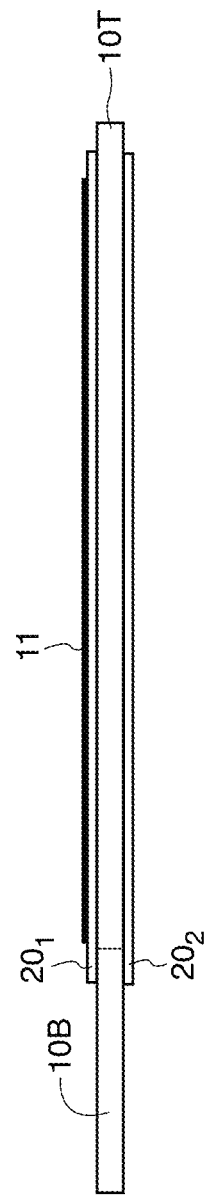

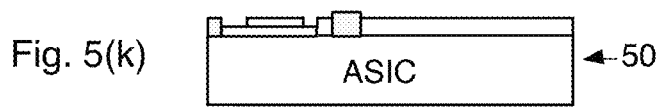
Fig. 5(k)
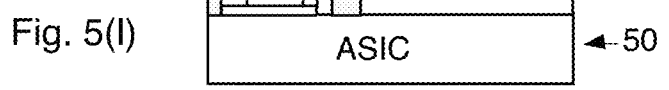
Fig. 5(l)
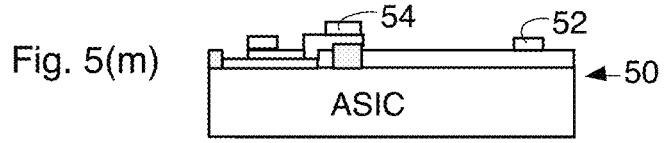
Fig. 5(m)
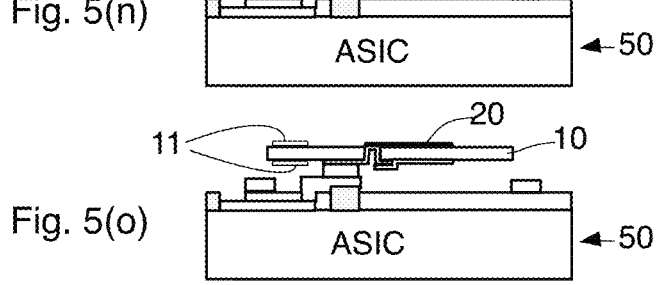
Fig. 5(n)
Fig. 5(o)
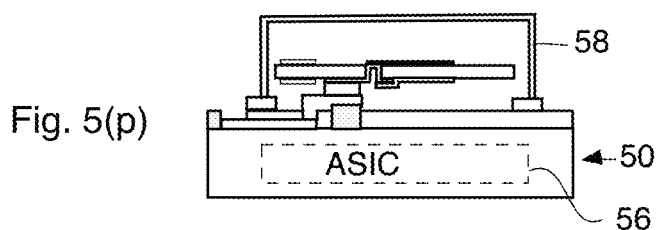
Fig. 5(p)
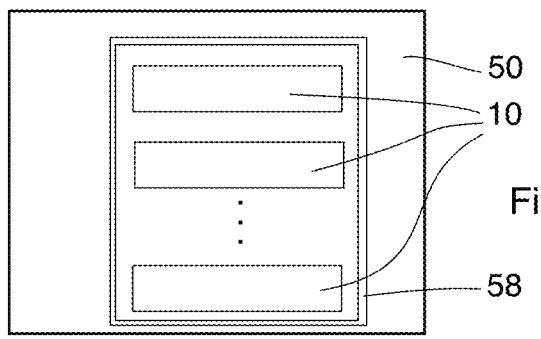
Fig. 5(q)

QUARTZ MEMS PIEZOELECTRIC RESONATOR FOR CHIPSCALE RF ANTENNAE

CROSS REFERENCE TO RELATED APPLICATIONS

This application is a division of U.S. patent application Ser. No. 15/965,652, filed Apr. 24, 2018 and entitled "A Quartz MEMS Piezoelectric Resonator for Chipscale RF Antenna", which application claims the benefit of U.S. Provisional Patent Application Ser. No. 62/521,174 filed Jun. 16, 2017 and also entitled "A Quartz MEMS Piezoelectric Resonator for Chipscale RF Antenna", the disclosures of which applications are whereby incorporated herein by reference.

This application is related to U.S. patent application Ser. No. 15/801,642 filed 2 Nov. 2017 and entitled "A High-Q Quartz-based Inductor Array for Antenna Matching" and its provisional application 62/417,111 filed 3 Nov. 2016, the disclosures of which is hereby incorporated herein by reference.

STATEMENT REGARDING FEDERALLY SPONSORED RESEARCH OR DEVELOPMENT

None.

TECHNICAL FIELD

The technology disclosed hereby relate to piezoelectric resonators which may be used as RF antennae, particularly small antennae. The disclosed piezoelectric resonators may be of a MEMS (MicroElectroMechanical Systems) or chipscale size.

BACKGROUND

Traditional wire-based transmit and receive antennas have very low efficiency for wavelengths much larger than their physical size due to the large reactance they present to coupling electronics and their very low radiation resistance. These limitations significantly reduce their efficiency (power radiated versus input power for a transmit antenna) to <<1% at frequencies<1 GHz ($\lambda$>0.3 m) for handheld communication systems. Thus, there is a great need to improve the efficiency of VLF to UHF antennas for compact commercial and military systems.

Recently, a new type of antenna has been investigated in which the RF signal is converted to an acoustic signal with a much smaller wavelength than the original signal due to a much slower acoustic velocity in materials compared to the speed of light. This allows small high efficiency antennas to be constructed since the detected energy is converted to a highly confined acoustic mode which is small compared to the original RF wavelength. The conversion of an electromagnetic wave to an acoustic signal is accomplished, as disclosed herein, thru a combination of a magnetostrictive material added to a piezoelectric element, thus converting the magnetic field energy to strain energy and then strain into a voltage in the piezoelectric element. At the piezoelectric element's mechanical resonance, this voltage is increased by the mechanical Q of the resonance. Thus, high Q piezoelectric elements are desirable for high sensitivity and high transmit power.

Previous work in this area has used lead zirconate Mutate (PZT) or AlN piezoelectric elements both on and off their mechanical resonances. See, for example:

1. J. Zhai, et. al., "Detection of Pico-Tesla Magnetic Fields using Magnetic-Electric Sensors at Room Temperature," *Applied Physics Letters* 88, (2006).
2. T. J. Klemmer, et. al., "Ultrahigh Frequency Permeability of Sputtered Fe—Co—B Thin Films," *J. of Applied Physics*, 87, (2000).
3. C-Y Lian, et. al., "Modeling of Magnetoelastic Nanostructures with a Fully Coupled Mechanical-Micromagnetic Model," *Nanotechnology* 25 (2014).
4. T. Nan, et. al., "Acoustically Actuated Ultra-Compact NEMS Magnetoelectric Antennas," *Nature Communications*, 8:296 (2017).
5. H. J. Kim, et. al., "Piezoelectric/Magnetostructure MEMS Resonant Sensor Array for in-Plane Multi-Axis Magnetic Field Detection," *IEEE MEMS* 2017.
6. High Magnetostrictive Coefficients of FeGaS Sputtered Films for Magnetostrictive Studies, G. Carman, private communication, (2017).

However, PZT and AlN material have relatively low Q ($\leq$1000) and have large frequency drifts over temperature ($\geq$3000 ppm). In this document, we describe a method to utilize quartz resonators with higher Q ($\geq$10,000) and much higher frequency stability (~10 ppm) to generate the electrical potential. The disclosed combined magnetostrictive/quartz resonator can be integrated directly on a RF signal processing chip using MEMS techniques to form a highly compact transceiver with high efficiency. Finally, arrays of low motional resistance resonators can be fabricated at wafer-level and 1) connected in series for increasing the signal strength for receivers or for 2) frequency hopping to increase the bandwidth of transmitters.

Three universities, which are believed to be actively researching in this area, are UCLA, Northeastern University, and Virginia Tech. Each have published in this area. See, for example, Zhi Yao, et al., "Bulk Acoustic Wave Mediated Multiferroic Antennas: Architecture and Performance Bound," *IEEE Transactions on Antennas and Propagation*, Vol. 63, August 2015, pp. 3335-3344; Tianxiang Nan, et al., "Acoustically Actuated Ultra-Compact NEMS Magnetoelectric Antennas," *Nature Communications*, 8:296 (DOI: 10.1038/541467-017-00343-8); Junyi Zhai, et al., "Detection of Pico-Tesla magnetic Fields using Magneto-electric Sensors at Room Temperature," *Applied Physics Letters*, vol. 88 (2006) (DOI: 10.1063/1.2172706). The UCLA modeling work has involved using YIG like magnetostrictive films with ZnO piezoelectric resonators. The Northeastern Univ. group have used AlN resonators with FeGaB magnetostrictive films. The Virginia Tech work involved Terfenol-D plates bonded with adhesives to PZT piezoelectric plates. All of these previous studies have involved piezoelectric resonators with low Q and high temperature sensitivities.

Quartz MEMS resonators manufactured by HRL Laboratories of Malibu, CA (HRL) have demonstrated Qs from 200,000 to 10,000 in these frequency ranges and have temperature stability which are typical of AT-cut quartz resonators (several ppm over temperature). In addition, many HRL manufactured quartz resonators have inherent resistance of <100 ohms which allows arrays of resonators to be connected for higher signal/noise. Novel quartz resonator designs are also described which can decouple the magnetostrictive films from the piezoelectric resonator for maintaining high Q even with the application of thick (~1 micron) magnetostrictive films. See, for example:

1. R. L. Kubena, F. P. Stratton, D. T. Chang, R. J. Joyce, and T. Y. Hsu, "Next Generation Quartz Oscillators and Filters for VHF-UHF Systems," 2006 *IEEE International Microwave Symposium*, San Francisco, Ca., Jun. 11-16, 2006.

2. R. L. Kubena, D. J. Kirby, Yook-Kong Yong, D. T. Chang, F. P. Stratton, H. D. Nguyen, R. J. Joyce, R. Perahia, H. P. Moyer, and R. G. Nagele "UHF Quartz MEMS Oscillators for Dynamics-Based System Enhancements,", 2013 *IEEE International Frequency Control Symposium*, Prague, Czech Republic, Jul. 22-26, 2013.

3. R. L. Kubena, F. P. Stratton, H. D. Nguyen, D. J. Kirby, D. T. Chang, R. J. Joyce, Y. K. Yong, J. F. Garstecki, M. D. Cross, and S. E. Seman, "A Fully Integrated Quartz MEMS VHF TCXO," 2017 *IEEE Frequency Control Symposium*, Besancon, Fr., pp. 68-71, July 2017.

As noted above, higher Q resonators with higher temperature stability can be expected using quartz instead of PZT or AlN resonators. This is due to the low mechanical losses in single crystal quartz, the ability to use energy trapping techniques in their design to limit acoustical losses to the substrates and sidewalls, and to the ability to use temperature compensated cuts of quartz for high thermal stability. In addition, most quartz resonators have low (<1 k$\Omega$) motional resistance. These features enhance the voltages produced across their electrodes for a given strain and produce high frequency stability for the antenna. If a local quartz oscillator is used for generating or demodulating the RF signal, the temperature coefficient of the antenna can be accurately matched to the local oscillator without the need for additional frequency adjusting electronics. In addition, the integrated magnetostrictive/quartz resonator can be bonded directly to an active electronic chip and vacuum sealed at wafer level to produce a low profile package with low parasitics compared to conventional ceramic packaging approaches used by commercial quartz manufacturers.

Based on our expected Q and previously published data (see J. Zhai, et al., "Detection of pico-Tesla magnetic fields using magneto-electric sensors at room temperature," *Applied Physics Letters*, 88, 062510 (2006)) we expect to be able to achieve magnetic field sensitivities<$10^{-14}$ T/$\sqrt{Hz}$ in the VHF band with a roughly 1 mm$^2$ size antenna that is less than 100 µm thick. This is nearly two orders of magnitude better than currently obtained sensitivities (see M. Li, et al., "Ultra-Sensitive MEMS Magnetoelectric Sensor for Picotesla DC Magnetic Field Detection," MEMS 2017) of $4\times10^{-13}$/$\sqrt{Hz}$ and with orders of magnitude better temperature stability. Finally, our quartz shear and extensional mode resonators can be designed with low fundamental mode $R_1$ ($\leq$100 ohms depending on the frequency). Thus, combining these resonators in series in an array is possible while keeping the total resistance less than typical high input impedance operational amplifiers.

Embodiments of the disclosed resonators can serve as an antenna for the reception and/or transmission of RF energy without the need for additional, traditional antenna elements. The disclosed resonators have a very high Q and therefor tend to operate at more or less fixed frequencies. When used in a frequency hopping application or in an application which required multiple frequencies be available for use, then multiple ones of the disclosed resonators (each tuned to a different frequency) can be used together in a single receiver and/or transmitter.

But, none of the previous magnetostrictive sensors have been reported to have both magnetic and electric field comparable sensitivities, and none have been configured in mounts that can determine the propagation direction and polarization of the RF wave from only a few sensors.

As is described herein, these new antenna elements respond to the electric and magnetic fields in an RF wave with a unique frequency signature. The electric field can produce the highest voltage across the plates at the antiresonance (high impedance frequency) of the resonator when connected to a high impedance load while the magnetic field can produce the highest voltage across the plates at the series resonance (low impedance of the resonator) when driving a low impedance amplifier. The difference in the frequency response can be filtered with high Q quartz filters to provide a user with the ability to determine the magnetic and electric fields strengths in particular directions. Embodiments with two resonators mounted in perpendicular sense directions provide the ability to determine the direction and polarization properties of an incident RF field.

BRIEF DESCRIPTION OF THE INVENTION

In one aspect the present invention provides a method of making a RF antenna in which a magnetostrictive film is deposited on a quartz wafer, the method comprising: patterning selected portions of a top surface of the quartz wafer for deposition of electrode metal and deposition of said magnetostrictive film and depositing said electrode metal and said magnetostrictive film; temporarily bonding the quartz wafer to a handle wafer; thinning the quartz wafer to a desired thickness; etching the quartz wafer to define the outlines of at least one quartz resonator bearing said electrode metal and said magnetostrictive film; patterning selected portions of a bottom surface the at least one quartz resonator for deposition of electrode metal and at least one bond pad and depositing said electrode metal and said at least one bond pad; bonding the at least one quartz resonator to a substrate wafer; and releasing the at least one quartz resonator from said handle wafer.

The magnetostrictive film may consist of a ferromagnetic material such as FeGaB or FeCoB or even Ni.

The step of patterning selected portions of the bottom surface the at least one quartz resonator may includes patterning for deposition of the magnetostrictive film on said bottom surface and depositing said magnetostrictive film on said bottom surface.

In some embodiment the magnetostrictive film is deposited directly on said quartz wafer while in other embodiments the magnetostrictive film is deposited directly on said electrode metal.

The RF antenna includes at least one quartz resonator which is embodied, for example, as either a tuning fork, extensional mode, or a shear mode quartz resonator.

A plurality of quartz resonators may be formed and all bonded to a substrate wafer, wherein at least some of plurality of quartz resonators bonded to the substrate wafer have different resonant frequencies so that the RF antenna has multiple frequencies at which it can operate corresponding to said different resonant frequencies of said quartz resonators.

In another aspect the present invention provides a RF antenna comprising: a quartz resonator having electrodes disposed thereon and a magnetostrictive film disposed on the quartz resonator either on, partially under or adjacent said at least one of said electrodes thereof.

The magnetostrictive film preferably comprises material selected from the group consisting of FeGaB, FeCoB or other ferromagnetic materials.

The disclosed combined magnetostrictive/quartz resonator can be utilized as a transmitting antenna (where a RF amplifier is connected to its metallic electrodes) and/or as, a receiving antenna (where the receiver's input (a preamp) is connected instead to the metallic electrodes).

BRIEF DESCRIPTION OF THE DRAWINGS

FIG. 1 is a top view of a magnetically-induced piezoelectric MEMS quartz tuning fork antenna for VLF or LF applications.

FIG. 1a depicts an enlarged view of one of the magnetostrictive material patches on the resonator of FIG. 1.

FIG. 1b is a cross sectional view taken through one of the tines of the tuning folk antenna of FIG. 1, this sectional view being taken along line 1b-1b in FIG. 1;

FIG. 3a is a top view and FIG. 3b is a side elevational view of magnetically-induced piezoelectric MEMS shear-mode resonator for VHF to UHF antenna applications.

DETAILED DESCRIPTION

Figure 2A:
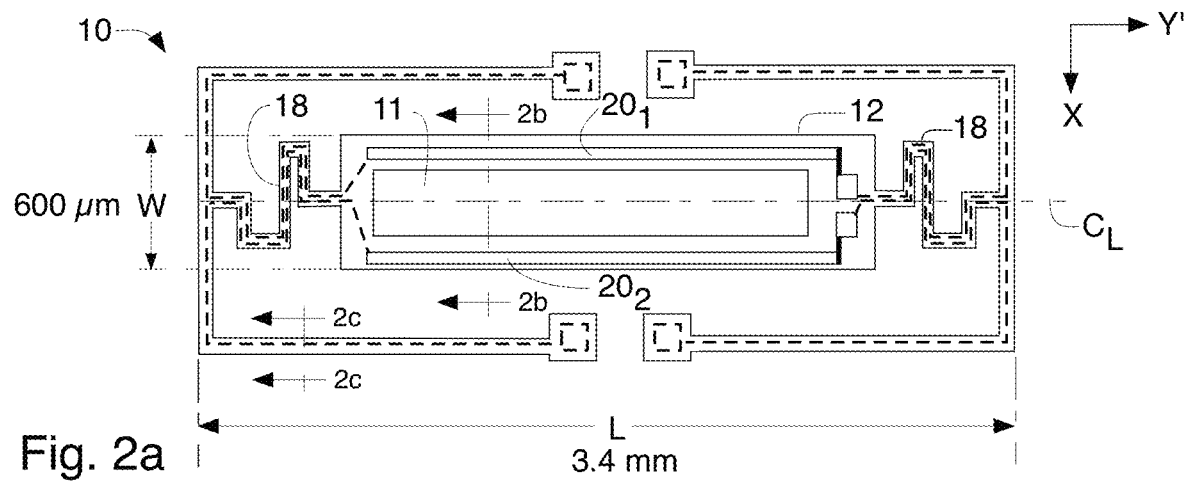
FIGS. 2a-2c are top and side elevational views of a magnetically-induced piezoelectric MEMS extensional-mode resonator useful as a RF antenna particularly in MF or HF antenna applications.

The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to (i) all papers and documents which are filed concurrently with this specification and which are open to public inspection with this specification (the contents of all such papers and documents are incorporated herein by reference) and (ii) all papers and documents which are otherwise incorporated by reference herein (but not physically filed with this specification).

All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the claims herein is not intended to invoke the provisions of 35 U.S.C. 112, Paragraph 6.

Fabrication processes for quartz MEMS devices have been described in previous U.S. Pat. Nos. 7,750,535; 7,851,971; and 8,765,615, and in U.S. patent application Ser. No. 14/973,701 filed Dec. 17, 2015 and in U.S. Provisional Patent Application Ser. No. 62/417,111 filed on Nov. 3, 2016, the disclosures of which are hereby incorporated herein by reference. These patents and patent applications describe starting with a quartz resonator wafer and depositing top-side electrode metal and the interconnect metal for running to the bond pads. However, in the new process a magnetostrictive film such as FeGaB or FeCoB is deposited, preferably with a sputtering process, either soon before of soon metallic electrodes are formed.

The resonator design can be a shear, extensional, or tuning fork design which determines the quartz cut angle, and lateral geometry of the quartz, and the position of the electrodes and the magnetostrictive film on the quartz plate.

An embodiment of a fabrication process for quartz MEMS process with magnetostrictive films in accordance with the present invention will be discussed subsequently with reference to FIGS. 5(a)-5(o). But before discussing the embodiment of the fabrication process of those figures, it is to be understood that the magnetostrictive film may be utilized with a tuning fork resonator design, a shear mode resonator design, or an extensional resonator mode design. The particular design selected for use in different applications will now be discussed.

The frequency of interest will likely be determine the particular design for the piezoelectric resonator to be used. The placement of the magnetostrictive film and its magnetostrictive properties will determine the transduction efficiency. For example, for a VLF to LF range (3 kHz to 300 kHz) of operation, a quartz MEMS tuning fork resonator as described U.S. patent application Ser. No. 14/973,701 filed Dec. 17, 2015, as modified herein, may be used. FIGS. 1, 1a and 1b depict an embodiment of a quartz MEMS tuning fork resonator (for use as a RF antenna) with two magnetostrictive film patches 11 formed on a base portion 10B of the quartz resonator substrate 10, the base portion 10B thereof being that portion from which the two quartz tines 10T of substrate 10 extend.

Electrodes $20_1$ and $20_2$ are formed on each tine 10T (and on the base portion 10B) and preferably on the upper and lower surfaces thereof as is depicted by FIG. 1b. Note that electrode $20_1$ basically surrounds electrode $20_2$ of one of the tine 10T in FIG. 1 while electrode $20_2$ basically surrounds electrode $20_1$ of the other tine 10T in FIG. 1. The same configuration (one electrode surrounding the other electrode) preferably follows as well for the electrodes located on the lower surface of quartz resonator plate 10. The electrodes $20_1$ on the upper and lower surfaces of plate 10 are connected in common at a metallic via $15_1$ while the electrodes $20_2$ on the upper and lower surfaces of plate 10 are connected in common at a metallic via $15_2$.

The length and width of the tines 10T control the resonant frequency and may be varied across the quartz wafer to produce an array of resonators, as discussed in U.S. patent Ser. No. 15/801,642 filed 2 Nov. 2017 and incorporated by reference with each resonator having a different resonant frequency. The magnetostrictive film patches 11 are preferably disposed on the base portion 10B of the resonator as shown in FIG. 1 to affect a tuning fork mode resonant mode through a lateral (in the x-direction) expansion/contraction of the films 11. The placement of patches 11 need not necessary be where depicted on FIG. 1, but the film patches 11 should preferably be located near where the tines 10T join the base portion 10B of the quartz plate 10. Possible alternate locations for the film patches 11 are shown by the dashed lined box 11A, which would place the film patches 11 basically immediately adjacent where the tines 10T depart from base portion 10B and under electrodes $20_1$ and $20_2$. Since the conductors of electrodes $20_1$ and $20_2$ are depicted within boxes 11A, the material selected for the magnetostrictive film patches 11 should be a dielectric material or, if an electrically conductive material is selected for the magnetostrictive film patches 11, then a dielectric material should be placed between the magnetostrictive film patches 11 and the electrodes $20_1$ and $20_2$. The locations of patches 11 is optimized in regions of maximum stress for the tuning fork mode. This lateral expansion/contraction is determined by direction of the induced magnetization in the magnetostrictive film and the direction of polarization of the incident magnetic field. By proper orientation of these parameters, and by finite element analysis of the stress of the resonator, one can optimize the coupling of the strain induced in the magnetostrictive films 11 and the tuning fork mode of the resonator of FIGS. 1, 1a and 1b. The lateral expansion/contraction of the magnetostrictive films 11 of the resonator embodiment of FIGS. 1, 1a and 1b should occur in either the depicted x or y' directions.

Possible magnetostrictive film material for patches 11 include FeGaB, FeCoB and Ni. The quartz plate 10 of the embodiment of FIGS. 1, 1a and 1b preferably has a cut, where its y' axis is rotated by a few degrees (perhaps 5° or so) compared to the natural y-axis of a quartz crystal. The dimensions given in FIG. 1 are exemplary and may be varied as the frequency of the resonator of this embodiment is varied.

For a frequency of operation in the MF to HF bands (300 kHz to 30 MHz), a preferable quartz resonator design would be an extensional-mode design in a KT-cut quartz plate for temperature compensation. In this embodiment, the magnetostrictive film patches 11 may be deposited on the upper and lower surfaces of central portion 12 which central portion 12 of the resonator depicted in the embodiment of FIGS. 2a-2c. The embodiment of FIGS. 2a-2c corresponds to the embodiment of FIGS. 1, 2a and 2b of U.S. patent application Ser. No. 15/801,642 filed 2 Nov. 2017 (except that magnetostrictive film patches 11 are added thereto in this embodiment), so it is not discussed in detail herein and the reader is advised to see the corresponding discussion in that US Patent Application. In the embodiment, the quartz plate 10 has a central portion 12 which is suspended by springs 18. Metal electrodes $20_1$ and $20_2$ along with a magnetostrictive film patch 11 are formed on the top and bottom sides of the central portion 12 as can be seen with reference to FIG. 2b herein. The important difference between the embodiment of FIGS. 2a-2c herein and the embodiment of FIGS. 1, 2a and 2b of U.S. patent application Ser. No. 15/801,642 is that between the lateral electrodes $20_1$ and $20_2$ is disposed magnetostrictive film patches 11 on the top and bottom surfaces of central portion 12. The two patches 11 are preferably of the same size and overlap each other. An expansion/contraction of the magnetostrictive film patches 11 directly drives the width extensional mode (in the x-direction) in the quartz and would couple the magnetostrictive strain and the piezoelectric mode. The direction of magnetostrictive strain is denoted by the letter S in FIG. 2b.

Figure 2B:
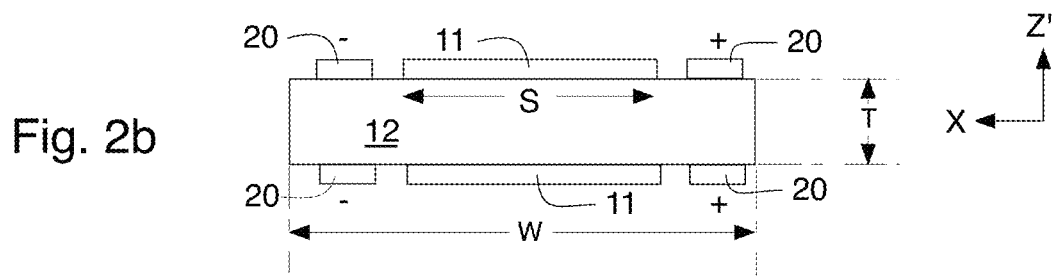
Figure 2C:
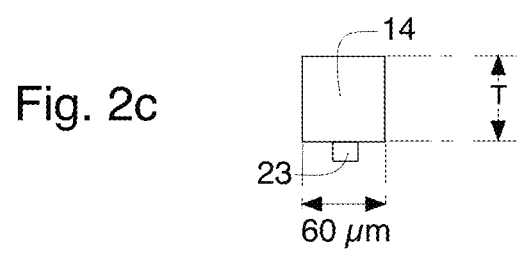

The dimensions given in FIGS. 2a-2c are exemplary and may be varied as the frequency of the resonator is varied. A plurality of resonators may be utilized together as is described with reference to FIG. 7 of U.S. patent application Ser. No. 15/801,642.

It is to be noted that the magnetostrictive film patches 11 preferably do not make electrical contact with the electrodes 20.

U.S. patent application Ser. No. 15/801,642 describes a number of different embodiments of extensional mode resonators and it should now be apparent that any of those embodiments (and modification thereof) may modified as suggested herein to incorporate magnetostrictive film patches 11 between or adjacent their electrodes 20.

For an even higher frequency of operation in the VHF to UHF ranges (30 MHz to 3 GHz), a quartz shear-mode resonator embodiment may be used with a quartz plate 10 preferably having an AT-cut for temperature compensation. This embodiment is shown in FIGS. 3a and 3b. The quartz plate 10 of the embodiment of FIGS. 3a and 3b preferably has a cut, where its y' axis is rotated compared to the natural y-axis of a quartz crystal and the z' axis is similarly rotated compared to the natural z-axis of a quartz crystal. In this embodiment, optimal coupling between the magnetostrictive film 11 and the resonator may occur using only a top or bottom magnetostrictive film 11 on one of the metal electrodes of the resonator. In the depicted embodiment the magnetostrictive film 11 is deposited on electrode $20_1$ and not on opposing electrode $20_2$. The single-sided configuration would allow shear strain to develop for a proper initial magnetic biasing and ac magnetic excitation. For example, if the initial dc magnetization in the magnetostrictive film 11 is developed in the vertical direction to the tine 10T of the quartz plate 10 (in the y'-axis direction), a detected ac magnetic field in the quartz's x-axis direction can produce a shear strain which can couple to the shear mode. The initial dc magnetization is ideally be produced during deposition of the magnetostrictive film 11 in the presence of a biasing dc magnetic field. The length of tine 10T may be several hundreds of 100 µm, and preferably in the range of 200 to 1000 µm.

Figure 4A:
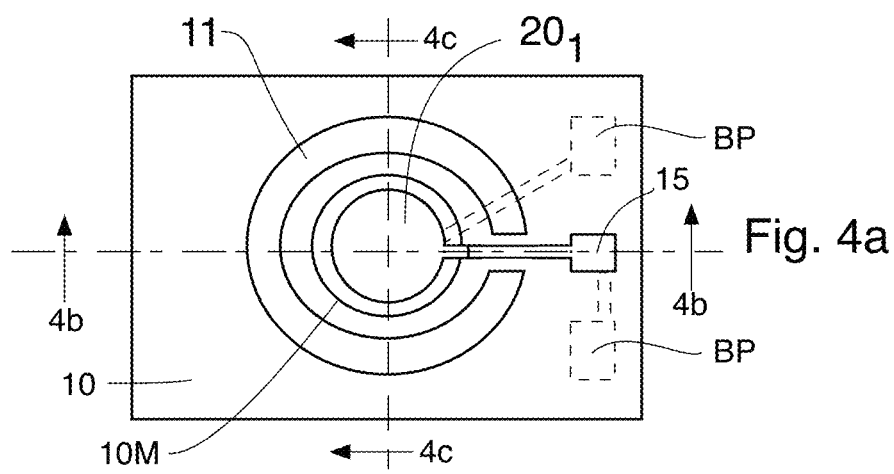
FIGS. 4a, 4b and 4c depict top and two side elevational views of magnetically-induced piezoelectric MEMS shear-mode resonator with the magnetic film separated from the electrode metal for increased Q.
Figure 4B:
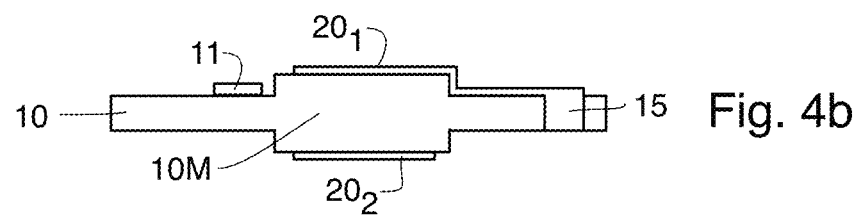
Figure 4C:
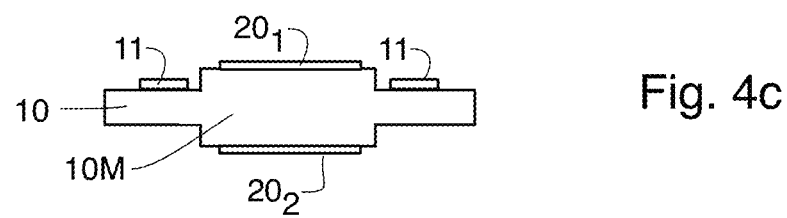

In an alternative embodiment (see FIGS. 4a, 4b and 4c) the magnetostrictive film 11 is deposited in an annular ring around the resonator which is formed on a quartz mesa 10M which may be located at or near the center of the antenna resonator. The metal electrodes $20_1$ and $20_2$ of the RF antenna resonator may be deposited in a separate annular ring or directly on the top (and the bottom) of the quartz mesa 10M as is shown in the embodiment of FIGS. 4a, 4b and 4c. The magnetostrictive film 11 is ideally deposited outside the mesa 10M and preferably only on one side of the quartz plate 10 for this shear mode antenna resonator. In FIG. 4a the magnetostrictive film 11 is disposed surrounding the resonator electrodes $20_1$ and $20_2$ (located on mesa 10M) while the magnetostrictive film 11 is located adjacent the mesa 10M. The top resonator electrode $20_1$ is connected by a deposited conductor to a metallic via 15 and thence to one of the bonding pads (BP). The bottom resonator electrode $20_2$ is connected by a separate deposited conductor (shown in FIG. 4a with dashed lines but omitted from FIG. 4b for sake of clarity) to the other bonding pad (BP). The advantage of this design is that the resonator (the mesa portion 10M) is not loaded by the magnetostrictive film 11, thus providing for a higher Q operation than if metal electrodes $20_1$ and $20_2$ of were embodied as two concentric annular rings either inwardly or outwardly of a ring-shaped body of magnetostrictive film 11 (and all disposed on a body of quartz having no mesa).

All of these designs can be fabricated by generally following the MEMS process which is described with reference to FIGS. 5(a)-5(o). Some designs have two vias, or one via or no vias, multiple tines or a single tine, so the process of FIGS. 5(a)-5(o) can be varied slightly to accommodate such differences and that should be apparent to persons skilled in the art who have read this disclosure. By applying the magnetostrictive film 11 as described above (in a steady state magnetic field as the magnetostrictive material is being deposited so as to impose a built-in magnetization as discussed, for example, above with reference to the embodiment of FIGS. 3a and 3b), the resonator can function as an RF antenna. Moreover, multiple resonators, as described herein, may be bonded in an array fashion to an active RF substrate which contains voltage or charge sensing devices for amplifying the piezoelectric signals which result from the resonators described herein sensing RF radiation within their operational bandwidths. See U.S. patent application Ser. No. 15/801,642 filed 2 Nov. 2017 which described using resonators as high Q devices which function as RF receiving antennas.

Figure 5A:
FIGS. 5(a)-5(o) present an embodiment of a fabrication process for a HF to VHF resonator in accordance with the present invention.

Continuing with FIG. 5(a)-5(q), the resonators described herein may be vacuum sealed at wafer level using a capping wafer 58 with one or more recesses etched in the bottom side which allows the resonators to operate with high Q while maintaining a thin profile of the final system. See FIG. 5(p). The resonators can be tailored in frequency by changing their design across the wafer or by various subtractive or additive processes such as laser ablation, ion sputtering, or selective deposition. An array of antennas with different resonant frequencies can be used with switches (in circuitry 56) for frequency hopping transmitter schemes to increase the system bandwidth (see U.S. patent application Ser. No. 15/801,642 filed 2 Nov. 2017 and its provisional application Ser. No. 62/417,111 filed 3 Nov. 2016) and mounted on a common substrate 50 as depicted by FIG. 5(q). An array of resonators 10 (see FIG. 5(q)) can be connected in series to increase the strength of the signal for a receiver. Since the impedance of the resonator array can be low compared to the input impedance of a subsequent amplifier, the coupling of the signal between the resonator array and the amplifying electronics can be high.

Figure 5B:
FIGS. 5(p) and 5(q) depicts a single chip RF transmitter and/or RF receiver with a plurality of antenna resonators bonded thereto for multiple frequency operation and which optionally are encapsulated by a cap wafer.

Turning to FIGS. 5(a)-5(o), a method of making a resonator with a magnetostrictive film 11 is described. The starting material for the resonator is a quartz slab 10 (preferably with a crystallographic orientation as described above) upon which a magnetostrictive film patch 11 such as FeGaB or FeCoB or Ni is selectively deposited by sputtering using, for example, a sputtering mask (not shown) either before or after the deposition of electrode 20. Only one electrode 20 is shown in FIG. 5(b) for ease of illustration, it being understood that certain embodiments might require multiple electrode such as electrodes $20_1$ and $20_2$ depicted for the embodiment of FIG. 1.

Figure 5C:
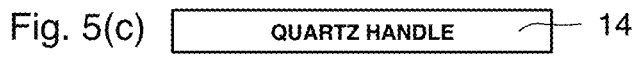
Figure 5D:
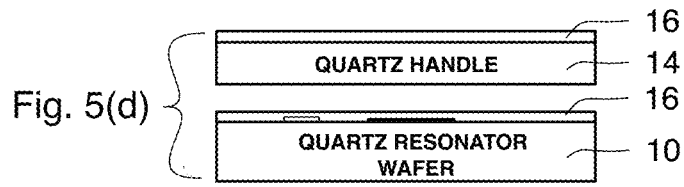
Figure 5E:
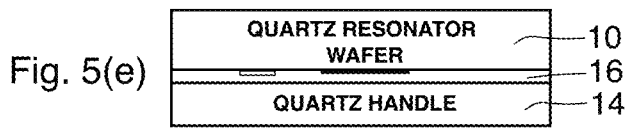
Figure 5F:
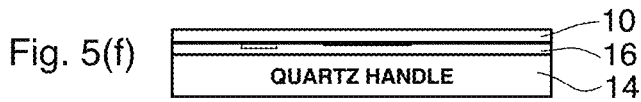

A handle wafer 14 is provided (see FIG. 5(c)), which is formed of the same or different material as is the quartz slab 10. Both the quartz slab 10 and the handle wafer 14 can be coated with a temporary adhesive 16 (see FIG. 5(d)). Then the quartz slab 10 and the handle wafer 14 are temporarily bonded together as shown in FIG. 5(e) using the temporary adhesive 16 or a direct fusion bond and the quartz slab 10 is then reduced in thickness by grinding and polishing as shown at FIG. 5(f).

Figure 5G:
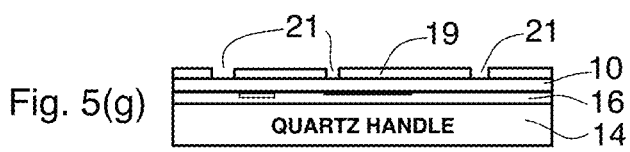
Figure 5H:
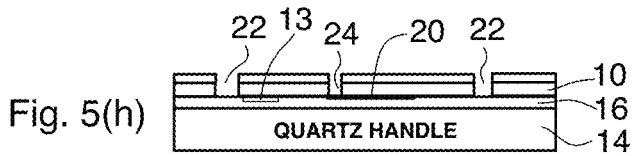

Next, a mask 19, which may be metal, is deposited and defined, using a photo-lithographic process, to form openings 21 in the mask 18 as shown by FIG. 5(g). Openings 21 permit the quartz slab 10 to be etched as shown by FIG. 5(h) to form a trench 22 defining the lateral extent of the resonator and one or more contact vias 24 exposing a small portion of the electrode 20 at the bottom of via 24. If multiple electrodes 20 are formed (as explained above), then multiple vias 24 can also be formed at the same time if appropriate.

Figure 5I:
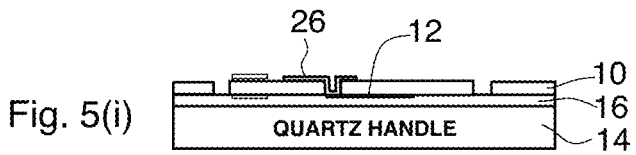
Figure 5J:
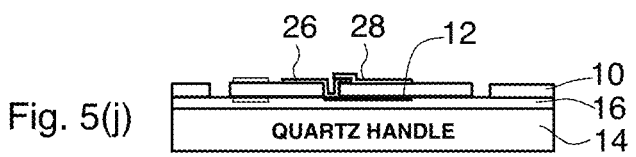

Next, as shown by FIG. 5(i), metal 26 is selectively deposited (using a suitable photo-lithographic process) in via 24 contacting the electrode 20 at the bottom of via 24 and forming a bond pad on the exposed surface of the quartz slab 10. Additional bond pads may be formed at the same time if desired (see bonding pads BP in FIG. 1 and FIG. 4a). Next, as shown by FIG. 5(j), an opposing electrode 28 is formed which may (or may not, as needed) ohmically contacts the electrode 20 at the bottom of via 24 due to the presence of metal 26 in via 24. Either before or after the opposing electrode 28 is deposited, an opposing patch (or patches) 11 of magnetostrictive film 11 may also be deposited (recalling that, in some embodiments, the magnetostrictive film 11 is deposited on only one side of the quartz plate 10). Electrode 20 may correspond to one of electrodes $20_1$ and $20_2$ while electrode 28 may correspond to the other one of electrodes $20_1$ and $20_2$ shown in the other figures.

An Application Specific IC (ASIC) 50 may also made (see FIG. 5(k) from a semi conductive substrate using techniques well known in the art. The ASIC 50 may include RF radio transmitter and/or receiver circuity 56 (see also FIG. 5(p)) along with the switches and amplifiers mentioned elsewhere herein. The ASIC 50 is provided with metal 52 as needed for (i) interconnecting the resonator with circuitry 56 and (ii) as a sealing surface for cap 58. Next, metal 54, such as indium, is deposited (see FIG. 5(m)) to allow a compression bond to be formed when the resonator of FIG. 5(i) is compression bonded to ASIC 50 as shown by FIG. 5(n).

The handle wafer 14 is then removed along with stray bits of the quartz plate by dissolving the temporary adhesive 16 (if used) or by etching away the handle wafer 14 thereby releasing the resonator(s) from the handle wafer 14 as shown by FIG. 5(o). A capping wafer 58 may be installed as depicted by FIG. 5(p) and as is described below.

The top and bottom electrodes 20 (which are alternatively identified with numerals $20_1$ and $20_2$ in other figures) form a sandwiched structure around the piezoelectric resonator formed by quartz slab 10. If the magnetostrictive film 11 is also deposited on both surfaces of the quartz slab 10 (or on one or more of the electrodes 20), then it too forms another sandwiched structure around the piezoelectric resonator.

No electrical connection needs to be made to the magnetostrictive film patches 11, so no additional bonding pads are required for the patches 11. The voltage developed between the metal electrodes 20 and 28 (or electrodes $20_1$ and $20_2$) is then used to sense the electromagnetic field in which the resonator is located, hence acting as a RF receiving antenna. The Q of the laminate resonator determines the bandwidth when used as a resonant detector (receiver) or even as a transmitting antenna. The wafer may be capped with a thin high-resistivity S4 capping wafer 58 (see FIG. 5(p)) for reducing air viscous losses and increasing the Q. The capping can be performed in a vacuum using e.g., a Au/Sn eutectic bond. For a high resistivity Si capping wafer with $\varrho=10^3$ Ω-cm and a frequency of the radiation of 1 MHz, the skin depth for the magnetic field attenuation through the capping wafer is 1.6 m. Thus, a thin Si capping wafer 58 of several 100 μms will not reduce the sensitivity or efficiency of the antenna.

As is shown by FIG. 5(*p*), multiple quartz slab resonators 10 may be bonded to a single ASIC wafer 50 and, if desired, encapsulated in a single Si capping wafer 58. The multiple quartz slab resonators 10 are preferably tuned to different frequencies thus enabling the single ASIC wafer to function as a multiple frequency single chip (if desired) transmitter and/or receiver with suitable receiving and/or transmitting circuitry 56 embedded in the ASIC wafer 50. Circuitry 56 may include amplifying electronics for increasing the strength of a voltage signal generated by the quartz piezoelectric material in response to a received RF signal (when the resonator functions as a RF receiving antenna). Circuitry 56 may include switching elements for frequency hopping a received or transmitted signal or for temporally increasing the bandwidth of the received or transmitted signal.

Having now described the invention in accordance with the requirements of the patent statutes, those skilled in this art will understand how to make changes and modifications to the present invention to meet their specific requirements or conditions. Such changes and modifications may be made without departing from the scope and spirit of the invention as disclosed herein.

The foregoing Detailed Description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this disclosure with respect to the current state of the art, but also contemplates advancements and that adaptations in the future may take into consideration of those advancements, namely in accordance with the then current state of the art. It is intended that the scope of the invention be defined by the Claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the Claims. No claim element herein is to be construed under the provisions of 35 U.S.C. Section 112, as it exists on the date of filing hereof, unless the element is expressly recited using the phrase "means for . . . " and no method or process step herein is to be construed under those provisions unless the step, or steps, are expressly recited using the phrase "comprising the step(s) of . . . . "

Modifications, additions, or omissions may be made to the systems, apparatuses, and methods described herein without departing from the scope of the invention. The components of the systems and apparatuses may be integrated or separated. Moreover, the operations of the systems and apparatuses may be performed by more, fewer, or other components. The methods may include more, fewer, or other steps. Additionally, steps may be performed in any suitable order. As used in this document, "each" refers to each member of a set or each member of a subset of a set.

What is claimed is:

1. A method of making a RF antenna in which a magnetostrictive film is deposited on a quartz wafer, the method comprising:
    patterning selected portions of a top surface of the quartz wafer for deposition of electrode metal and deposition of said magnetostrictive film and depositing said electrode metal and said magnetostrictive film;
    temporarily bonding the quartz wafer to a handle wafer;
    thinning the quartz wafer to a desired thickness;
    etching the quartz wafer to define the outlines of at least one quartz resonator bearing said electrode metal and said magnetostrictive film;
    patterning selected portions of a bottom surface the at least one quartz resonator for deposition of electrode metal and at least one bond pad and depositing said electrode metal and said at least one bond pad;
    bonding the at least one quartz resonator to a substrate wafer; and
    releasing the at least one quartz resonator from said handle wafer.

2. The method of making a RF antenna according to claim 1 wherein the magnetostrictive film consists of material such as FeGaB or FeCoB or other ferromagnetic material.

3. The method of making a RF antenna according to claim 1 wherein the step of patterning selected portions of the bottom surface the at least one quartz resonator includes patterning for deposition of the magnetostrictive film on said bottom surface and depositing the magnetostrictive film on said bottom surface.

4. The method of making a RF antenna according to claim 1 wherein the magnetostrictive film is deposited directly on said quartz wafer.

5. The method of making a RF antenna according to claim 1 wherein the magnetostrictive film is deposited directly on said electrode metal.

6. The method of making a RF antenna according to claim 1 wherein the at least one quartz resonator is a tuning fork, extensional mode, or a shear mode quartz resonator.

7. The method of making a RF antenna according to claim 1 wherein a plurality of quartz resonators are formed and all bonded to said substrate wafer, and wherein at least some of plurality of quartz resonators bonded to said substrate wafer have different resonant frequencies.

\* \* \* \* \*